US006420876B1

(12) United States Patent
Saha et al.

(10) Patent No.: US 6,420,876 B1
(45) Date of Patent: Jul. 16, 2002

(54) FAULT LOCATION IN A MEDIUM-VOLTAGE NETWORK

(75) Inventors: Murari Saha, Västerås (SE); Eugeniusz Rosolowski, Wroclaw (PL)

(73) Assignee: ABB AB, Vasteras (SE)

(*) Notice: Subject to any disclaimer, the term of this patent is extended or adjusted under 35 U.S.C. 154(b) by 0 days.

(21) Appl. No.: 09/646,007
(22) PCT Filed: Feb. 19, 1999
(86) PCT No.: PCT/SE99/00226
   § 371 (c)(1),
   (2), (4) Date: Dec. 27, 2000
(87) PCT Pub. No.: WO99/46609
   PCT Pub. Date: Sep. 16, 1999

(30) Foreign Application Priority Data

Mar. 9, 1998 (SE) .............................................. 9800741

(51) Int. Cl.$^7$ .............................................. G01R 31/08
(52) U.S. Cl. ......................................... 324/522; 702/58
(58) Field of Search .......................... 324/522; 361/79, 361/80, 81, 65; 702/58

(56) References Cited

U.S. PATENT DOCUMENTS

| 4,107,778 A | * | 8/1978 | Nii et al. ..................... 324/522 |
| 4,996,624 A | | 2/1991 | Schweitzer, III ............. 324/522 |
| 5,367,426 A | | 11/1994 | Schweitzer, III ............. 361/63 |

FOREIGN PATENT DOCUMENTS

DE 1954267 A1 6/1970

OTHER PUBLICATIONS

M. S. Sachdev et al., "Determining Locations of Faults In Distribution Systems", IEE(UR)—Developments in Power System Protection, Mar. 25–25, 1997, Conference Publication No. 434, pp. 188–191.

R. K. Aggarwal et al., "An Interactive Approach To Fault Location On Overhead Distribution Lines With Load Tapes", IEE, 1997—Developments in Power System Protection, Mar. 25–27, 1997, Conference Publication No. 434, pp. 184–187.

* cited by examiner

*Primary Examiner*—Christine K. Oda
(74) *Attorney, Agent, or Firm*—Dykema Gossett PLLC

(57) ABSTRACT

In a medium-voltage network, a method and a device for location of a fault on one of the lines having loaded branches. Common voltage and sum current are measured centrally prior to and after the occurrence of a fault. Positive sequence impedance of the line and a fictitious value of the positive-sequence impedance of the line, as viewed from each branch, is determined. A change of the fictitious value of two consecutive branches from a positive to a negative value is interpreted as if the fault is located on the intermediate line section. The fictitious value defines the distance on the line section from the branch with the latest positive value to the fault. The total distance to the fault is equal to the sum of the line sections up to the branch having positive values plus the distance of the faulty line section.

4 Claims, 3 Drawing Sheets

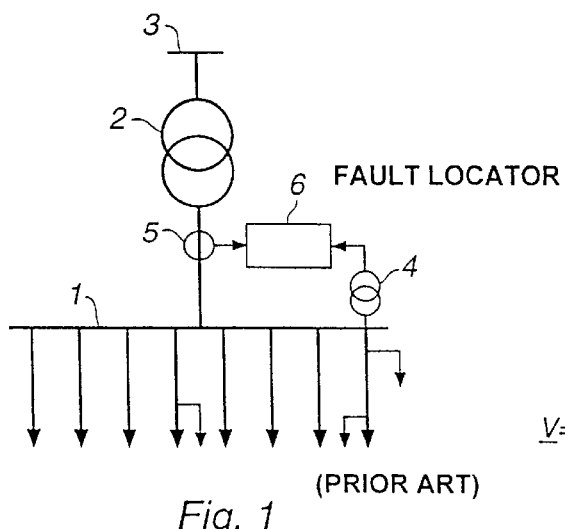
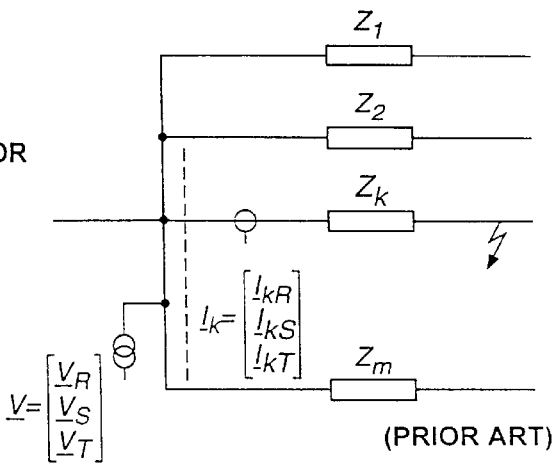
Fig. 1 (PRIOR ART)
Fig. 2 (PRIOR ART)
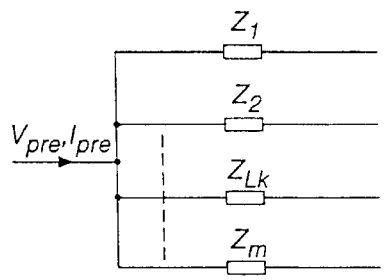
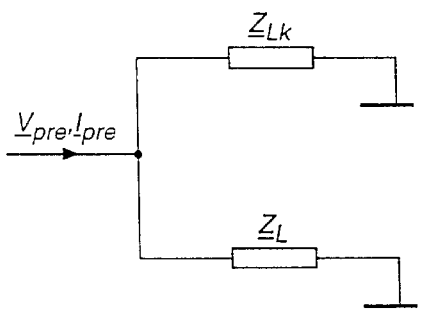
Fig. 3a
Fig. 3b
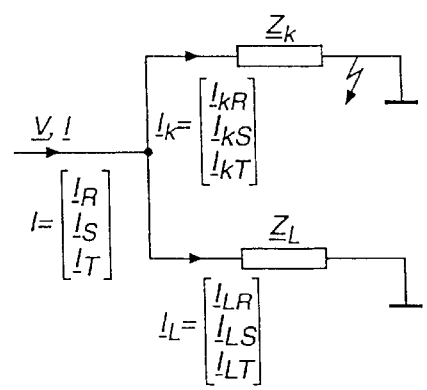
Fig. 4

FAULT LOCATION IN A MEDIUM-VOLTAGE NETWORK

TECHNICAL FIELD

The present invention relates to a method and a device for fault location in a medium-voltage network according to FIG. 1. In the following description, a medium-voltage network will be referred to as an MV network. An MV network comprises a number of lines, which may each, in turn, branch off into a number of branch lines. The lines are supplied from MV switchgear 1 in an MV station. The MV switchgear is supplied via a transformer 2 from high-voltage switchgear 3. In an installation where the invention will be used, measurement of the common supply voltage and sum voltage of the lines is performed with the measuring devices 4 and 5 in the MV station, where also a so-called fault locator 6 is located.

Fault location in the MV network is normally an integral part of superordinate protection systems relating to faults on circuit breakers, contactors, relays etc. With the aid of various protection, monitoring and so-called expert systems, the faulty line may be determined.

By means of a method and a device according to the invention, determination of the distance to the fault on the faulty line may be performed with the aid of the values of voltage and the sum current of the lines, measured in the MV station.

The principle of distance determination according to the invention is particularly useful for cable networks but may also advantageously be used for overhead line networks.

BRIEF DESCRIPTION OF THE DRAWINGS

FIG. 1 shows the configuration of a normal medium-voltage network.

FIG. 2 shows the location of measuring devices for measuring voltage and current, when current measurement is performed directly on the faulty line.

FIGS. 3a and 3b show the assumption made according to the invention, that is, during central measurement of voltage and the sum current of the lines, in order to be able to distinguish a possible faulty line before the occurrence of a fault.

FIG. 4 shows the assumption made according to the invention in order to distinguish the faulty line after the occurrence of a fault.

BACKGROUND ART, PROBLEMS

Figure 5:
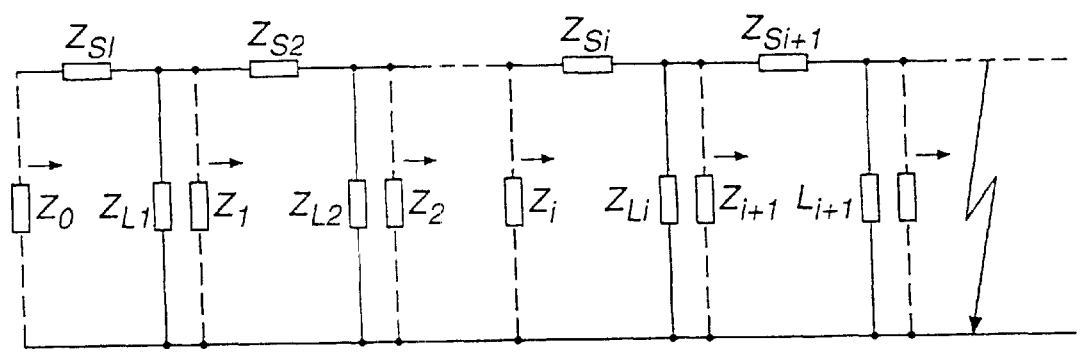
FIG. 5 shows how a faulty line may consist of a number of line sections with loads at the branch points between the line sections.

The state of the art as regards fault location in an MV network comprises two fundamentally different methods.

One of the methods is based on the provision of a fault locator on each line, which entails heavy investment costs, and the other method comprises measuring the voltage and the sum current for all the MV lines centrally in the MV station.

The latter method involves a plurality of problems, which make it difficult to obtain a relatively reliable measure of the distance to the fault:

in connection with fault location, there are often made assumptions that the current in a faulty line is equal to the difference between measured current after and prior to the occurrence of a fault, which introduces a certain error in the determination of the distance;

if the line comprises motor drives, this may lead to power being fed into the MV network, and such feeding of power is difficult to compensate for;

the line may comprise one or more substations and closed loops;

a fault locator is programmed for a given number of branches with respective loads at given distances from the MV network. Since connection and disconnection of parts of the line may occur at different times, it is important to update programmed data.

In an article entitled "Determining Locations on Faults in Distribution Systems", Developments in Power System Protection, Mar. 25–27th 1997, Conference Publication No. 434, IEE 1997, a method for determining distance is described, wherein a central measurement of the voltage and the sum current for all the lines is performed. The fault-located line may have a plurality of distributed branch points, nodes, where also some branch have parallel loads. The starting-point are voltage and current measured at the MV station prior to and after the occurrence of a fault, whereupon the respective positive-sequence components are determined. It is assumed that the data of the line between each node and the load at each node prior to a fault are known. First the assumption is made that the fault is located at a node F between node x and node x+1. Then, a load model is formed, with loads on nodes up to node x equal to those which existed prior to the occurrence of the fault and that the load on all the nodes from node x+1 is at the last node. With the aid of the load model, positive-sequence components of current and voltage after the occurrence of the fault at node x and at the far end are then calculated as a function of the distance from node x to the fault node F.

A first assumed value of the distance to the fault is determined on the basis of the positive-sequence admittance of the remote end prior to the fault. The positive-sequence components of current and voltage at the fault node after the occurrence of the fault are then used for determining the first calculated value of the distance to the fault. These two values are compared with each other, and if the difference is greater than a least value set in advance, a new assumption is made as to between which nodes the fault is located, based on the value now calculated. This provides a new load model and a second calculated value of the distance to the fault. This value is then compared when the first calculated value, which comparison may result in an additional numb of iterations until the difference value between two consecutively calculated values lies within the permissible values. The method does not permit fault location in case of a three-phase fault.

For determining the distance to a fault when voltage and current measurement are performed at the faulty line, there is a classical method for determining the positive-sequence impedance $Z_k$ of the faulty line, as will be clear from FIG. 2, in case of a phase-to-phase fault or a three-phase fault according to the following:

$$Z_k = \frac{V_{pp}}{I_{kpp}} \tag{1}$$

$V_{pp}$—phase-to-phase voltage, e.g.: $V_{pp}=V_R-V_S$,
$I_{kpp}$—phase-to-phase fault current, e.g.: $I_{kpp}=I_{kR}-I_{kS}$.

When the fault is a phase-to-ground fault, the corresponding impedance is determined as $$Z_k = \frac{V_{ph}}{I_{kph} + k_{kN} I_{kN}} \quad (2)$$

$V_{pk}$—voltage of the faulty phase,
$I_{kph}$—current of the faulty phase, $$k_{kN} = \frac{Z'_0 - Z'_1}{3 Z'_1} \quad (3)$$

$Z'_0$, $Z'_1$—the zero-sequence and positive-sequence impedances per unit of length of the faulty line $$I_{kN} = I_{kR} + I_{kS} + I_{kT} \quad (4)$$

One way of making the determination of the distance to a fault when performing measurement on the relevant faulty line is clear from an article entitled "An Interactive Approach to Fault Location on Overhead Distribution Lines with Load Taps", Development in Power System Protection, Mar. 25–27th 1997, Conference Publication No. 434, IEE, 1997, in which the term "overhead distribution lines" relates to an overhead line intended for medium voltages. This article presents a technique and an algorithm for fault location on overhead lines based on determining the difference in voltage prior to and after the occurrence of a fault at an assumed fault point on the line based on voltages, measured in the supply station of the line, prior to and after the occurrence of a fault. This voltage is then used for checking the currents in the non-faulty phase at the assumed fault point. Only when the assumed fault point is correct, will the current in the non-faulty phases assume a value near zero. This methods does not permit any fault location at a three-phase fault and the voltage measurement must be performed in the supply station of the line in question.

SUMMARY OF THE INVENTION, ADVANTAGES

The present invention relates to a method for location of a fault which has arisen on one of the lines in a medium-voltage network by using a fault locator located in the MV station of the lines. All the lines originate from the MV station, where voltage and sum current are measured and recorded immediately prior to and after the occurrence of a fault. Further, it is assumed that the data and the load of the lines are known. This implies that the distance of the lines and their impedance between branches and the load of the respective branch are known. Each branch may also have one or more branches of its own with known loads.

To be able to determine the distance from the MV station to the location of a fault according to the invention, certain assumptions are made according to FIGS. 3a, 3b and 4. Thus, there are a number of outgoing lines, each one represented by the impedance $Z_1$, $Z_2$, . . . $Z_{Lk}$, $Z_m$ of the respective line according to FIG. 3a. Now, it is assumed that the line with the impedance $Z_{Lk}$ is the line which will experience a fault. According to FIG. 3b, the following are now defined $Z_L$—the parallel connection of the impedances of all the lines except for the impedance of the line which becomes faulty;

$Z_{LK}$—impedance of the line which becomes faulty;

$$Z_{pre} = \frac{V_{pre}}{I_{pre}} = \frac{Z_L Z_{Lk}}{Z_L + Z_{Lk}} \quad (5)$$

$V_{pre}$, $I_{pre}$—phase-to-phase or phase-to-ground symmetrical voltage/current positive-sequence components.

The assumption as regards the post-fault conditions is clear from FIG. 4. The invention now comprises determining the positive-sequence impedance $Z_k$ of the MV line with the impedance $Z_{LK}$ including the fault impedance and where it is assumed that the load $Z_L$ is the same as the pre-fault load. Depending on the type of fault which has occurred, that is, whether it is a phase-to-phase fault/three-phase fault or a phase-to-ground fault, which may be determined with a superordinate protection system or an expert system, $Z_k$ will be different.

If the fault is a phase-to-phase fault/three-phase fault, the positive-sequence impedance of the load may be written as $$Z = \frac{V_{pp}}{I_{pp}} = \frac{Z_L Z_k}{Z_L + Z_k} \quad (6)$$

$V_{pp}$—phase of the fault loop to phase voltage, e.g. $V_{pp} = V_R - V_S$,
$I_{pp}$—phase of the fault loop to phase current, measured at the MV station, e.g. $I_{pp} = I_R - I_S$
$Z_k$—the positive-sequence impedance of the faulty line.
Combining equations (5) and (6) gives:

$$Z_k = \frac{Z Z_{pre}}{Z_{pre} - Z(1 - k_{zk})} \quad (7)$$

where $$k_{zk} = \frac{Z_{pre}}{Z_{Lk}} = \frac{S_{Lk}}{S_\Sigma} \quad (8)$$

$S_{Lk}$—pre-fault load on the faulty line,
$S_\Sigma$—pre-fault sum load in all lines including the faulty line.
Combining equations (5) and (8) gives:

$$k_{zk} = \frac{Z_L}{Z_L + Z_{Lk}} \quad (9)$$

The coefficient $k_{zk}$ for the relevant line is determined on the basis of the pre-fault load situation. In an MV station with a large number of lines, the coefficients are near zero and are changed very little. As an example, $k_{zk}$ for two identically loaded lines is equal to 0.5 and for 20 lines equal to 0.05.

Utilizing equation (6), equation (7) may also be written as:

$$Z_k = \frac{V_{pp}}{I_{pp} - (1 - k_{zk}) \frac{V_{pp}}{Z_{pre}}} \quad (10)$$

In case of a single-phase fault to ground and when the MV network is only grounded at the MV station, the zero-sequence current measured at the station will comprise both the current $I_{kN}$ of the faulty line and the zero-sequence current $I_{CL}$ which flows through the capacitances of the non-faulty lines to ground. In ground networks, $I_{CL}$ may be considerable and must be taken into consideration when determining the distance to fault. The zero-sequence current measured at the station may thus be written as:

$$I_N = I_{kN} + I_{CL} = I_R + I_S + I_T \tag{11}$$

The total capacitive zero-sequence current may be written as:

$$I_{C0} = I_{kC} + I_{CL} = \frac{V_0}{-jX_{C0}} \tag{12}$$

$X_{C0}$—the capacitive zero-sequence reactance of the whole MV network and $$X_{C0} = \frac{1}{\omega C_{S0}}$$

$C_{S0}$—the zero-sequence capacitance of the whole MV network.

With knowledge of the zero-sequence capacitance of the whole network and of the individual lines, the capacitive zero-sequence current may be written as:

$$I_{CL} = I_{C0} - I_{kC} = \frac{(1 - k_{zk0})V_0}{-jX_{C0}} \tag{13}$$

$$k_{zk0} = \frac{X_{C0}}{X_{C0k}} = \frac{C_{C0k}}{C_{S0}} \tag{14}$$

$C_{C0k}$—the capacitance to ground in the faulty line
$C_{S0}$—the capacitance of all the lines, including the faulty line, to ground.

Using equations (13) and (14), the following is obtained:

$$I_{kN} = I_N - I_{CL} = I_N - \frac{(1 - k_{zk0})V_0}{-jX_{C0}} \tag{15}$$

Since only the phase current $I_{ph}$ measured at the MV station is available, the current $I_{kph}$ in equation (2) must be expressed as a function of the current $I_{ph}$. For a fault condition according to FIG. 4, thus, the following may be written for the phase variables:

$$I_{kph} = I_{ph} - I_{Lph} \tag{16}$$

$I_{Lph}$—the current in the non-faulty phases.

When it is only a question of a phase-to-ground fault, the phase current in all the non-faulty lines may be written as $$I_{Lph} = \frac{V_{ph} - V_0}{Z_L} \tag{17}$$

$$V_0 = (V_R + V_S + V_T)/3 \tag{18}$$

Inserting equation (17) in equation (16) gives:

$$I_{kph} = I_{ph} - \frac{V_{ph} - V_0}{Z_L} \tag{19}$$

and, finally, inserting equation (19) in equation (2) gives:

$$Z_k = \frac{V_{ph}}{I_{ph} - \frac{V_{ph} - V_0}{Z_L} + k_{kN} I_{kN}} \tag{20}$$

Using equations (8) and (9), the following is obtained:

$$Z_L = \frac{k_{zk}}{1 - k_{zk}} Z_{Lk} = \frac{Z_{pre}}{1 - k_{zk}} \tag{21}$$

which means that $$Z_k = \frac{V_{ph}}{I_{ph} + k_{kN} I_{kN} - (1 - k_{zk}) \frac{V_{ph} - V_0}{Z_{pre}}} \tag{22}$$

By inserting $Z_{pre}$ according to equation (5) in equation (22), it may be transformed into $$\frac{1}{Z_k} = \frac{I_{ph} + k_{kN} I_{kN} - (1 - k_{zk}) \frac{V_{ph} - V_0}{Z_{pre}}}{V_{ph}} = \tag{23}$$

$$\frac{I_{ph} + k_{kN} I_{kN}}{V_{ph}} - \frac{(1 - k_{zk}) \frac{V_{ph} - V_0}{Z_{pre}}}{V_{ph}}$$

which, by comparison with equation (2), may be written as $$\frac{1}{Z_k} = \frac{1}{Z_g} - \frac{(1 - k_{zk})\left(1 - \frac{V_0}{V_{ph}}\right)}{Z_{pre}} \tag{24}$$

i.e. where $$Z_g = \frac{V_{ph}}{I_{ph} + k_{kN} I_{kN}} \tag{25}$$

Inversion of equation (24) gives $$Z_k = \frac{Z_g Z_{pre}}{Z_{pre} - Z_g (1 - k_{zk})\left(1 - \frac{V_0}{V_{ph}}\right)} \tag{26}$$

When there is a single-phase fault to ground and when the MV network is only grounded at the MV station and when the capacitive ground currents, which arise in case of a ground fault, are to be taken into account, to sum up, quantities and constants in equation (26) are defined as follows:

$$Z_{pre} = \frac{V_{pre}}{I_{pre}} = \frac{Z_L Z_{Lk}}{Z_L + Z_{Lk}} \quad (5)$$

$V_{pre}$, $I_{pre}$—are phase-to-phase or phase-to-ground symmetrical components;
$Z_L$—the parallel connection of the impedance of all the lines except for the impedance of the faulty line;
$Z_{Lk}$—impedance of the line which becomes faulty $$k_{zk} = \frac{Z_L}{Z_L + Z_{Lk}} \quad (9)$$

$$V_0 = (V_R + V_S + V_T)/3 \quad (18)$$

$V_{ph}$—voltage of the faulty phase and quantities and constants in equation (25) are defined as follows:
$V_{ph}$—as for equation (26) voltage of the faulty phase;
$I_{ph}$—current in the faulty phase $$k_{kN} = \frac{Z_0 - Z_1}{3Z_1} \quad (3)$$

$Z_0'$, $Z_1'$—the zero- and positive-sequence impedances per unit of length of the faulty line $$I_{kN} = I_N - I_{CL} = I_N - \frac{(1 - k_{zk0})V_0}{-jX_{CO}} \quad (15)$$

$$I_N = I_R + I_S + I_T \quad (11)$$

$$k_{zk0} = \frac{C_{C0k}}{C_{S0}} \quad (14)$$

$C_{C0k}$—zero-sequence capacitance to ground of the faulty line;
$C_{S0}$—zero-sequence capacitance of all the lines, including the faulty line, to ground.

The object of the invention is to determine the distance from an MV station to a fault on an identified line, starting from a calculated value, according to the above, of the positive-sequence impedance of the faulty line as viewed from the MV station. In MV networks, as described above, each line normally has a number of loaded branches with intermediate line sections, as is clear from FIG. 5. Thus, there is a first line section with impedance $Z_{S1}$ up to the first branch with the load impedance $Z_{L1}$. Then follows the next line section with impedance $Z_{S2}$ up to the second branch with the load impedance $Z_{L2}$ etc. The calculated positive-sequence impedance $Z_k$ of the line is indicated in FIG. 5 as the dashed impedance $Z_0$ (note the difference with respect to $Z_0'$, $Z_1'$, i.e. the zero- and positive-sequence impedances per unit of length of the faulty line included in equation (3)). By way of introduction to the process for fault location, a fictitious impedance $Z_1$ is indicated in FIG. 5, at the first branch, and this corresponds to the forward or remaining part of the positive-sequence impedance of the line, as viewed from the first branch. This implies that the positive-sequence impedance $Z_0$ of the line may be conceived as the impedance $Z_{S1}$ of the first line section in series with the parallel connection of the first load impedance $Z_{L1}$ and the fictitious positive-sequence impedance $Z_1$ of the line, as viewed from the first branch, that is, $$Z_0 = Z_{S1} + \frac{Z_{L1} Z_1}{Z_{L1} + Z_1} \quad (27)$$

whereby the fictitious positive-sequence impedance in the first branch will be $$Z_1 = \frac{Z_{L1}(Z_0 - Z_{S1})}{Z_{L1} - (Z_0 - Z_{S1})} \quad (28)$$

Consequently, the fictitious positive-sequence impedance of the line, as viewed from the $i^{th}$ branch, will be $$Z_{i+1} = \frac{Z_{Li}(Z_i - Z_{Si})}{Z_{Li} - (Z_i - Z_{Si})} \quad (29)$$

The method according to the invention comprises calculating, according to equation (28), the fictitious positive-sequence impedance $Z_1$ of the line, as viewed from the first branch. If the calculated value is negative, that is, if $Z_{S1} > Z_0$, this is interpreted as if the fault lies on the first line section. If the calculated value is positive, the calculation of the fictitious positive-sequence impedance at the following branches is continued according to equation (29) until two consecutive values $Z_i$ and $Z_{i+1}$ change from a positive value to a negative value, that is, when $Z_{Si} > Z_i$, which is interpreted as if the fault is located on the line section between the $i^{th}$ and the $i+1^{th}$ branches.

The distance from $l_f$ from the $i^{th}$ branch is then determined as $$l_f = \frac{Im(Z_i)}{Im(Z_{Si})} l_i \quad (30)$$

where Im is equal to the imaginary part of the respective fictitious impedance and $l_i$ is the length of the $i^{th}$ line section.

The total distance from the MV station to the fault becomes the sum of the lengths of all the line sections up to the $i^{th}$ branch plus the calculated $l_f$, that is, $$l_F = \Sigma l_i + l_f \quad (31)$$

Figure 6:
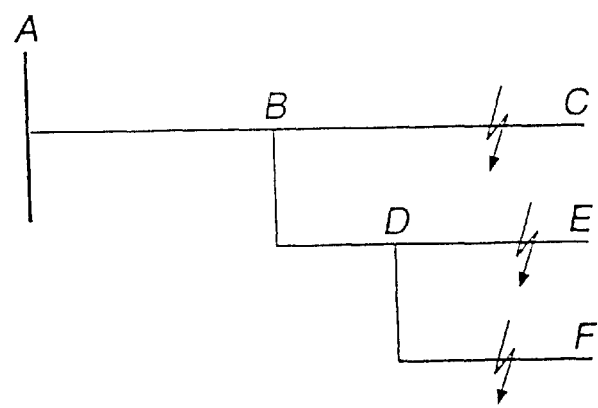
FIG. 6 shows the method for determining the distance to a fault when one branch has a plurality of sub-branches.

After having first determined $Z_k$, according to the equations described for the fault in question, the described method with equation (29) for determining the line section on which the fault has occurred and with equation (30) for fault-distance determination on the relevant line section and with equation (31) for the total distance to a fault may also be used when a branch has one or more branch lines with loads, as is clear, for example, from FIG. 6. The procedure for fault location in an MV network according to FIG. 6 is clear from the following:

First, equation (29) is applied to the line from A up to the branch at B. If the calculated $Z_{i+1}$ at B is positive, the calculation continues on line section B to C with the assumption that the load at branch B consists of the total load at branch B which comprises both the load on the line section B-C and the load on the other line sections B-D, D-E and D-F, connected to B. Independently of whether the fault is present on line section B-C or not, a second fault location is sought on line section B-D with the same total load as for the fault determination on line section B-C. This method is always applied when the calculation continues from one line branch with two or more sub-branches. If the fault is located on some of the line sections B-C or B-D, the calculation is stopped and the distance determination using equation (30) may be performed. If the fault cannot be located on any of the line sections B-C or B-D, the same procedure continues for the sub-branch point D until that line section where the fault has occurred has been located, that is, when the calculated value according to equation (29) has become negative.

With the aid of a method according to the invention, it is thus possible to determine the distance to a fault which has occurred on a line which is part of an MV network, based on measurement of the common voltage of the network and the sum current of the lines and with knowledge of the data of the network with respect to line lengths, impedances, loads, etc. This implies that it is not necessary with current measurement and a fault locator for each of the lines in the network.

DESCRIPTION OF THE PREFERRED EMBODIMENTS

Figure 7:
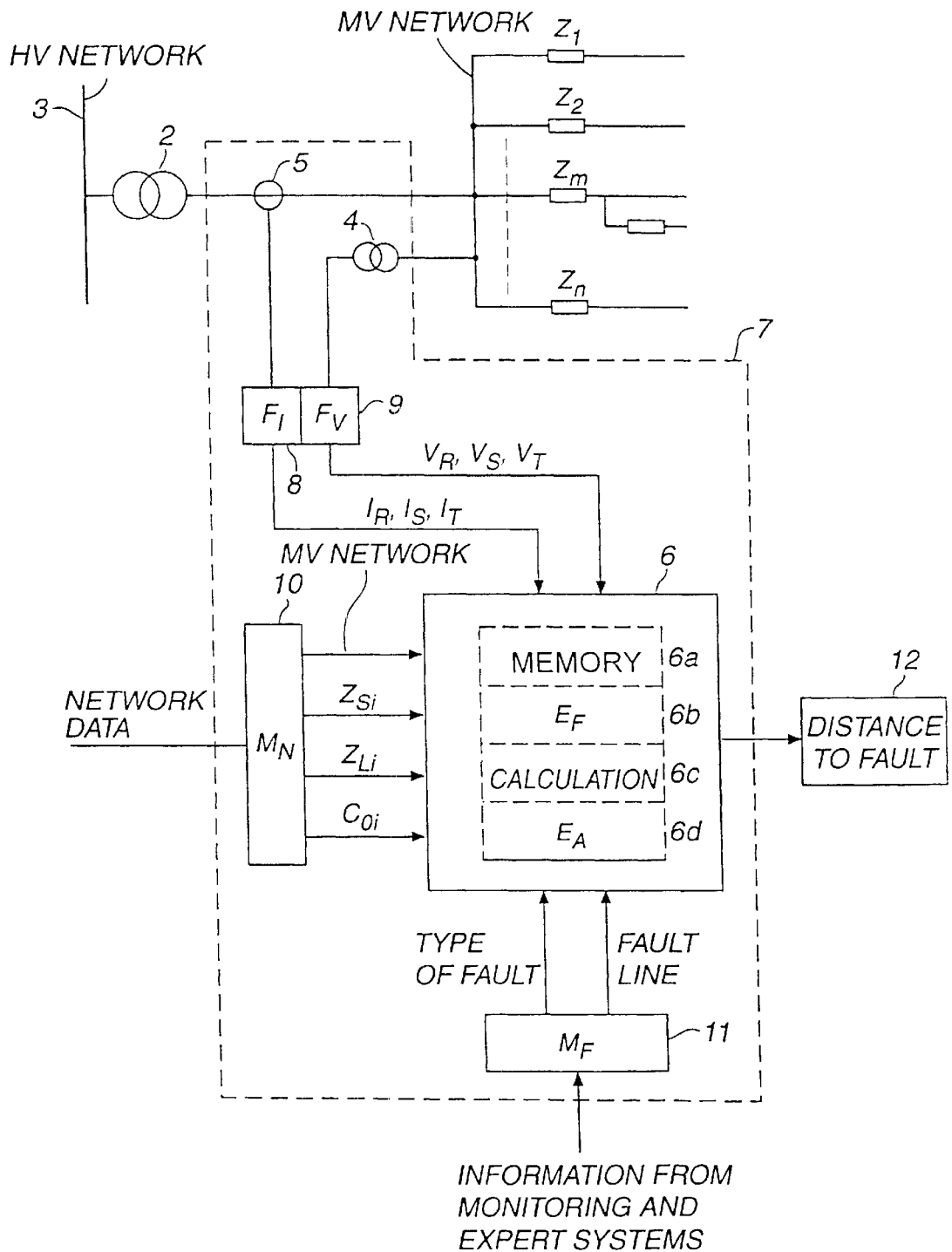
FIG. 7 shows an embodiment of a device according to the invention for fault location on one of the lines included in an MV network.

A device 7 according to the invention for fault location on one of the lines included in an MV network is clear from FIG. 7 and comprises:

a fault locator 6, voltage and current measuring devices 4 and 5, with filters $F_I$, 8 and $F_V$, 9 for continuously inputting to the fault locator measured values of voltage and sum current values, measured at an MV station, for all the lines included in the network, a unit $M_N$, 10, for inputting MV network data to the fault locator, when $Z_{Li}$ is the local impedance of the $i^{th}$ band, $Z_{Si}$ is the impedance of the ith section, $C_{0i}$ is the capacitance of the $i^{th}$ line, and a unit $M_F$, 11, for inputting information about the type of fault and about which line has become faulty, after a fault has occurred.

The fault locator 6 comprises:

a memory, 6a, for storing consecutive sequences of inputted measured data which enable determination of measured values of voltage and sum current immediately prior to and after a fault has occurred, and a memory for storing inputted network data, a unit $E_F$, 6b, for receiving information about the type of fault and about which line has become faulty, calculating methods, 6c, for calculating, on the basis of inputted data, the distance from the MV station to the site of the fault, a unit $E_A$, 6d, for supplying a value of the calculated distance to fault.

The network data which, via the unit $M_N$, 10, are to be inputted into the fault locator comprise:

information about the configuration of the MV network, that is, how network, lines and branches are connected to the MV network, information about the length and impedance of the line sections, information about the load impedance in all the branches, information about the positive-sequence capacitance of all the lines to ground.

The network data which, after a fault has occurred, are to be inputted into the fault locator via the unit $M_F$, 11 comprise information about the type of fault, that is, if it is a phase-to-phase fault or if it is a phase-to-ground fault, information about which line has become faulty.

The information about the type of fault and which line has become faulty is fetched from a superordinate protection and expert system.

Since the procedure for calculation with the described algorithms has been iterated, that is, when a calculated distance to fault from the MV station has been calculated, this is presented via the unit $E_A$, 6d, for example on a visual display unit 12.

A device according to the invention for fault location on one of the lines included in an MV network may be designed in a plurality of ways similar to that shown in FIG. 7. Thus, for example, the filters 8 and 9 for filtering measured data for current and voltage and the input units 10 and 11 for network data and fault information may be more or less integrated into the fault locator 6.

What is claimed is:

1. A method for location of a fault which has occurred on one of a plurality of lines in a medium-voltage (MV) network where the lines extend from the switchgear located in an MV station and where the location of the fault is determined with the aid of measured values of the common supply voltage of the lines and the sum current of the lines in the station prior to and after the occurrence of the fault, and using data representing the configuration of the network and electrical data including the number of lines, branches, lengths of lines between the branches and the representative line impedances and of actual loads on the lines and loads at branches, and wherein knowledge is obtained, via a superordinate protection system, as to which line has become faulty and which fault has occurred, wherein a fictitious positive-sequence impedance for the line as viewed from the $i^{th}$ branch is determined as follows:

$$Z_{i+1} = \frac{Z_{Li}(Z_i - Z_{Si})}{Z_{Li} - (Z_i - Z_{Si})} \tag{29}$$

where $Z_{Li}$ is equal to the load impedance at the $i^{th}$ branch, $Z_i$ is equal to the fictitious positive-sequence impedance of the line as viewed from the i-1$^{th}$ branch, $Z_{Si}$ is equal to the impedance of the $i^{th}$ line section, and the determination is stated by assuming $Z_i = Z_0$, where $Z_0$ is equal to the positive-sequence impedance of the line, as viewed from the station, and is determined with the aid of voltage and sum current values, measured at the station, said network data, and the determination of the fictitious positive-sequence impedance of the line, as viewed from the $i^{th}$ branch, is repeated until two consecutive values $Z_i$ $Z_{i-1}$ change from a positive value to a negative value, whereupon the distance to the fault from the $i^{th}$ branch is determined to be:

$$l_f = \frac{Im(Z_i)}{Im(Z_{Si})} l_i \tag{30}$$

where $Im(Z_i)$ is equal to the imaginary part of $Z_i$, $Im(Z_{Si})$ is equal to the imaginary part of $Z_{Si}$, $l_i$ is equal to the length of the $i^{th}$ line section, and the distance from the station to the fault is equal to the sum of the lengths of all line sections up to the $i^{th}$ branch plus the calculated distance $l_i$ to the fault from the $i^{th}$ branch $$l_F = \Sigma l_i + l_f \tag{31}$$

2. A method for location of a fault which has occurred on one of the lines in a medium-voltage network according to claim 1, wherein, when the fault is a single-phase fault to ground and when the network is only grounded at the station, the positive-sequence impedance $Z_0$ of the line, as viewed from the station, is determined by:

$$Z_k = \frac{Z_g Z_{pre}}{Z_{pre} - Z_g(1-k_{zk})\left(1-\frac{V_0}{V_{ph}}\right)} \quad (26)$$

where, $$Z_{pre} = \frac{V_{pre}}{I_{pre}} = \frac{Z_L Z_{Lk}}{Z_L + Z_{Lk}} \quad (5)$$

$V_{pre}$, $I_{pre}$ is the phase-to-phase or phase-to-ground symmetrical components, $Z_L$ is the parallel connection of the impedance of all the lines except for the impedance of the faulty line, $Z_{Lk}$ is the impedance of the line which becomes faulty, $$k_{zk} = \frac{Z_L}{Z_L + Z_{Lk}} \quad (9)$$

$$V = (V_R + V_S + V_r)/3 \quad (18)$$

$V_{ph}$ is the voltage of the faulty line, $$Z_g = \frac{V_{ph}}{I_{ph} + k_{kN} I_{kN}} \quad (25)$$

$I_{ph}$ — the current of the faulty line $$k_{kN} = \frac{Z_0 - Z_1}{3Z_1} \quad (3)$$

$Z_0$, $Z_i$ is the zero-sequence and positive-sequence impedances per unit of length of the faulty line, $$I_{kN} = I_N - I_{CL} = I_N - \frac{(1-k_{zk0})V_0}{-jX_{C0}} \quad (15)$$

$$I_N = i_R = I_S = I_T \quad (11)$$

$$k_{zk0} = \frac{C_{C0k}}{C_{S0}} \quad (14)$$

$C_{C0k}$ is zero-sequence capacitance to ground of the faulty line, and $C_{S0}$ is the zero-sequence capacitance of all the lines, including the faulty line, to ground.

3. A method for location of a fault which has occurred on one of the lines in a medium-voltage network according to claim 1, wherein, when the fault is a phase-to-phase fault or a three-phase fault, the positive-sequence impedance $Z_0$ of the line, as viewed from the station, is determined by:

$$Z_k = \frac{V_{pp}}{I_{pp} - (1-k_{zk})\frac{V_{pp}}{Z_{pre}}} \quad (10)$$

$V_{pp}$ is phase of the fault loop to phase voltage, $V_{pp} = V_R - V_S$, $I_{pp}$ is phase of the fault loop to phase current, measured at the MV station, $I_{pp} = I_R - I_S$ $$k_{zk} = \frac{Z_{pre}}{Z_{Lk}} = \frac{S_{Lk}}{S_\Sigma} \quad (8)$$

$S_{Lk}$ is pre-load fault in the faulty line, and $S_r$ is pre-fault sum load in all the lines, including the faulty line.

4. A device for carrying out the method according to claim 1 for location of a fault which has occurred on one of the lines in a medium-voltage network, comprising:

a fault locator, voltage and current measuring devices, with filters $F_I$, and $F_V$, for continuously inputting into the fault locator measured values of voltage and sum current values, measured at the MV station, for all the lines included in the network, a unit $M_N$, for inputting MV network data into the fault locator, and a unit $M_F$, for inputting information about the fault and about which line has become faulty, after a fault has occurred, and wherein the fault locator comprises:

a memory, for storing consecutive sequences of inputted measured data immediately prior to and after the occurrence of a fault, and for storing inputted network data, a unit $E_I$, for receiving information about the type of fault and about which line has become faulty, calculating methods for calculating, on the basis of inputted data, the distance from the MV station to the site of the fault, and a unit $E_A$, for supplying a value of the calculated distance to the fault.

* * * * *